United States Patent [19]

Nagato et al.

[11] Patent Number: 5,057,904
[45] Date of Patent: Oct. 15, 1991

[54] SOCKET UNIT FOR PACKAGE HAVING PINS AND PADS

[75] Inventors: Mitsuki Nagato, Kawasaki; Thutomu Yoshizaki, Yokosuka, both of Japan

[73] Assignee: Fujitsu Limited, Kawasaki, Japan

[21] Appl. No.: 319,713

[22] Filed: Mar. 7, 1989

[30] Foreign Application Priority Data

Mar. 18, 1988 [JP] Japan ................ 63-063621

[51] Int. Cl.⁵ ............ H01L 23/12; H01L 23/14; H01L 23/04
[52] U.S. Cl. ................................. 357/74; 357/80
[58] Field of Search .............. 357/75, 74, 80, 79; 174/52.4; 361/393, 394, 395, 397, 398, 399, 413, 414, 415, 400; 437/211, 209; 439/72, 73, 74, 75, 76, 77, 78, 79, 80, 81, 82, 525, 526

[56] References Cited

U.S. PATENT DOCUMENTS

| 4,390,220 | 6/1983 | Benasutti | 174/52.4 |
| 4,441,119 | 4/1984 | Link | 357/80 |
| 4,724,472 | 2/1988 | Sugimoto et al. | 357/80 |
| 4,742,385 | 5/1988 | Kohmoto | 357/74 |
| 4,793,058 | 12/1988 | Lenaleck | 361/414 |
| 4,816,426 | 3/1985 | Bridges et al. | 437/211 |
| 4,822,550 | 4/1989 | Komathu | 437/211 |

FOREIGN PATENT DOCUMENTS 59-117252 7/1984 Japan .

Primary Examiner—Rolf Hille
Assistant Examiner—S. V. Clark
Attorney, Agent, or Firm—Staas & Halsey

[57] ABSTRACT

A package and socket unit for testing a pin grid array package which includes a package having a plurality of pads electrically connected to pins and surrounding an area in which the pins are arranged, and a socket having contacts adapted to be electrically connected to the pads and provided with a chamber in which the pins are received without contact between the walls and the bottom of the chamber. The unit also may include a carrier for holding the package in the socket.

6 Claims, 5 Drawing Sheets

SOCKET UNIT FOR PACKAGE HAVING PINS AND PADS

BACKGROUND OF THE INVENTION

1. Field of the Invention

The present invention relates to a package and socket unit and more particularly, to a package and socket unit housing a pin grid array package, used in a burn-in process whereby an initial test for an IC device, for example, a high temperature test, is carried out, and a carrier in used to hold the package.

2. Description of the Related Art

A PGA (Pin Grid Array) package in which a plurality of pins are perpendicularly projected in arrays is well known as an element of IC devices used, for example, in a supercomputer. Currently, the degree of density of the IC device has gradually increased and the PGA package has been correspondingly gradually miniaturized; for example, a PGA package having about 260 pins set in an area 30 mm has been produced wherein the pins have a very small diameter of, e.g., 0.4 mm.

When the production of a PGA package is completed, a burn-in process used for a high temperature test is usually carried out at an early stage of the testing of the IC device. In this high temperature test, the PGA package is usually kept at a temperature of about 120° C. for a prolonged time, e.g., 48 to 96 hours, to determine whether failures such as wire-breaks have occurred.

To carry out the high temperature test, an electric current must be supplied to the IC device to be tested, and thus a socket connectable to power source pins (leads) among the pins of the PGA package, is provided and the power source pins are plugged into the socket to enable an electric current to be supplied through contacts in the socket which receive the power source pins.

When, however, the number of pins of the PGA package is very high, and accordingly the pitch between the pins is greatly reduced, failures occur due to an incorrect mating between the pin and the contacts of the socket. To ensure a satisfactory contact between the power source pins and the contacts of the socket, the contacts must be precisely positioned, and therefore, the socket production costs are very high.

Further, when the number of pins is increased, the pin diameter necessarily becomes smaller as described above, and therefore, when the power source pins are mated with contacts of a socket before carrying out the burn-in process, the power source pins are often bent and sometimes broken, which reduces the productivity yield. This problem also occurs with the pins for signal lines.

Japanese unexamined patent publication (Kokai) No. 57-117252 published on July 6, 1984 discloses a dummy test pad having bonding pads connected thereto. The dummy pad is arranged outside the bonding pads and is used to test and detect failures of the pads. Accordingly, if the technique of using this dummy pad is utilized for the above-described burn-in process, the above problems such as bending or breaking of the power source pins etc., can be solved.

SUMMARY OF THE INVENTION

An object of the present invention is to prevent bending or breaking of power source pins of a PGA package during the preparation for a burn-in process test.

Another object of the present invention is to provide a package and socket unit wherein a PGA package and a socket are easily mated.

Therefore, according to the present invention, there is provided a package and socket unit comprising a package having a plurality of pads electrically connected to pins and surrounding an area in which the pins are arranged, and a socket having contacts to be electrically connected to the pads and a chamber in which the pins are received without contact between the pins and the chamber walls and bottom.

The invention also includes a carrier for the package, the carrier having holes formed therein to receive the pins of the package, the diameter of each hole being such that the value (n) of play of the pin in the hole in a horizontal direction when the pin is inserted into the hole while matching the center line of the pin to that of the hole, is smaller than the tolerance (m) of the pitch (p) of the pin. This kind of carrier of a PGA type package is mated with a socket having contacts which are pressed against pads formed on the package through holes formed in the carrier.

There is further provided a socket unit for an integrated circuit comprising: a package for the integrated circuit having a back surface, a plurality of pins provided vertically on the back surface, and a plurality of pads provided on the back surface and at the peripheral area of said pins; a carrier means for holding said package, said carrier means having a base facing said back surface of the package when said is held package, a plurality of holes formed in the base and through which said pins are inserted; a plurality of access holes formed at the base and at the peripheral area of the holes, for exposing said pads to the back of the base, and guide portions provided on the corners of the base, for positioning said package on the carrier; and a socket having a socket base for holding said carrier, a window means formed at the socket base, for receiving said pins when the package and carrier are mated, a plurality of contacts (27) formed at the peripheral area of the window means, contacting portions of the contacts being inserted into said access holes so as to come into contact with the pads of the package, and a lid means provided on the socket base for pressing the package against the contacts.

DESCRIPTION OF THE PREFERRED EMBODIMENTS

The preferred embodiments of the present invention will now be described with reference to the accompanying drawings.

Figure 1A:
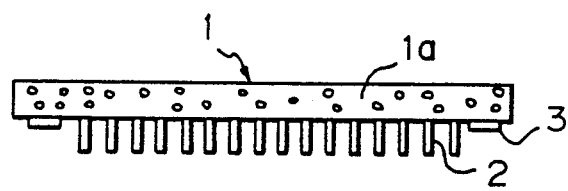
FIGS. 1A and 1B are a cross-sectional side view and a top plan view, respectively of a pin grid array (PGA) package according to the present invention.
Figure 1B:
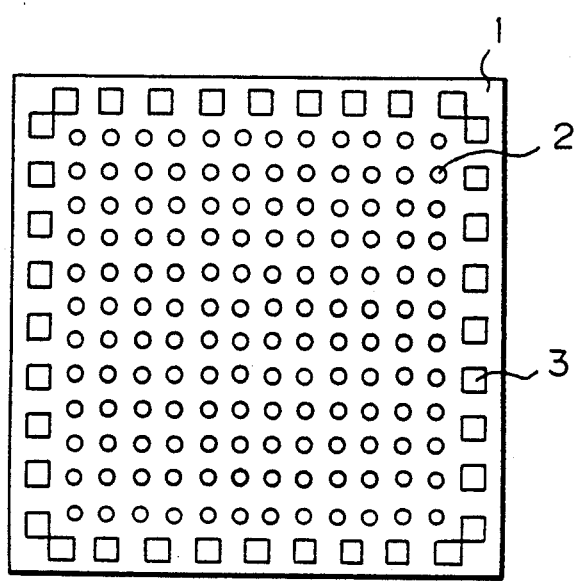

FIGS. 1A and 1B are a cross-sectional view and a top plan view, respectively, of a pin grid array (PGA) package according to the present invention.

As shown in FIGS. 1A and 1B, the PGA package 1 has a package body 1a, a plurality of pins (leads)2, and power source pads 3. A semiconductor chip with a large scale integrated circuit is included in the package body 1a in a known manner. The plurality of pins 2 comprises a plurality of signal pins and a plurality of power source pins, and are provided on substantially the entire back surface of the body 1a. Each of the power source pad 3 is electrically connected to the power source pins 2.

The diameter of each pin 2 is about 0.4 mm and the distance therebetween is about 1.2 mm. Each power source pad 3 is about 1 mm square, and a plurality of pads 3 are arranged around the pins 2.

Figure 2:
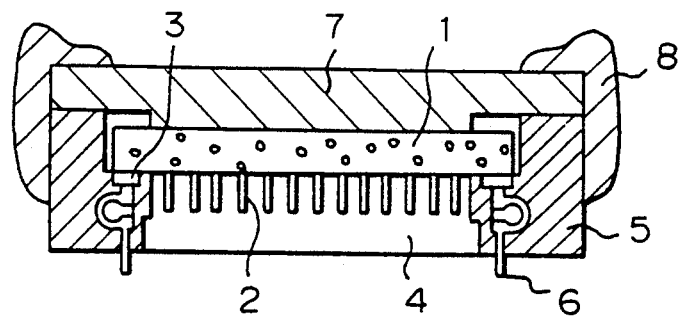
FIG. 2 is a cross-sectional view of a package and socket unit.

FIG. 2 is a cross-sectional view of a package 1 and socket unit 5. In the unit, the power source pads 3 of the package 1 are electrically connected to contacts 6 of the socket 5, and power is supplied to power source pins 2 through the pads 3 and the contacts 6. The socket 5 is provided with a chamber 4 in which a plurality of the pins 2 are set without contact between the walls and the bottom of the chamber 4.

Accordingly, since the PGA package 1 is provided with the socket 5 of the present invention, an electric current can be supplied to the pins 2 without bringing the pins 2 into contact with the contacts 6 of the socket 5, when the package 1 is mated with the socket 5, and thus bending and breaking of the pins 2 are prevented. Further, the pads 3 of the package 1 have a wider area in contact with the contacts 6 than in contact with the pins 2 of the package 1. Accordingly, since the alignment of the pad is easy, and at the same time, the contact area is wide, an electric current can be stably supplied. As shown in FIG. 2, the socket 5 has a socket lid 7 and the package 1 is positioned between the socket 5 and the socket lid 7. Further, a pressure element 8 is used to maintain firm contact between the pads 3 of the package 1 and the contacts 6 of the socket 5. This combination of socket and package allows, for example, a high temperature test in a burn-in process, to carried out in the most effective manner.

An example wherein a package is not directly received in a socket but is received therein while the package is held by a carrier, will now be explained.

According to the example, even if the gaps between pins are further reduced the handling and the alignment thereof remains easy.

Figure 3:
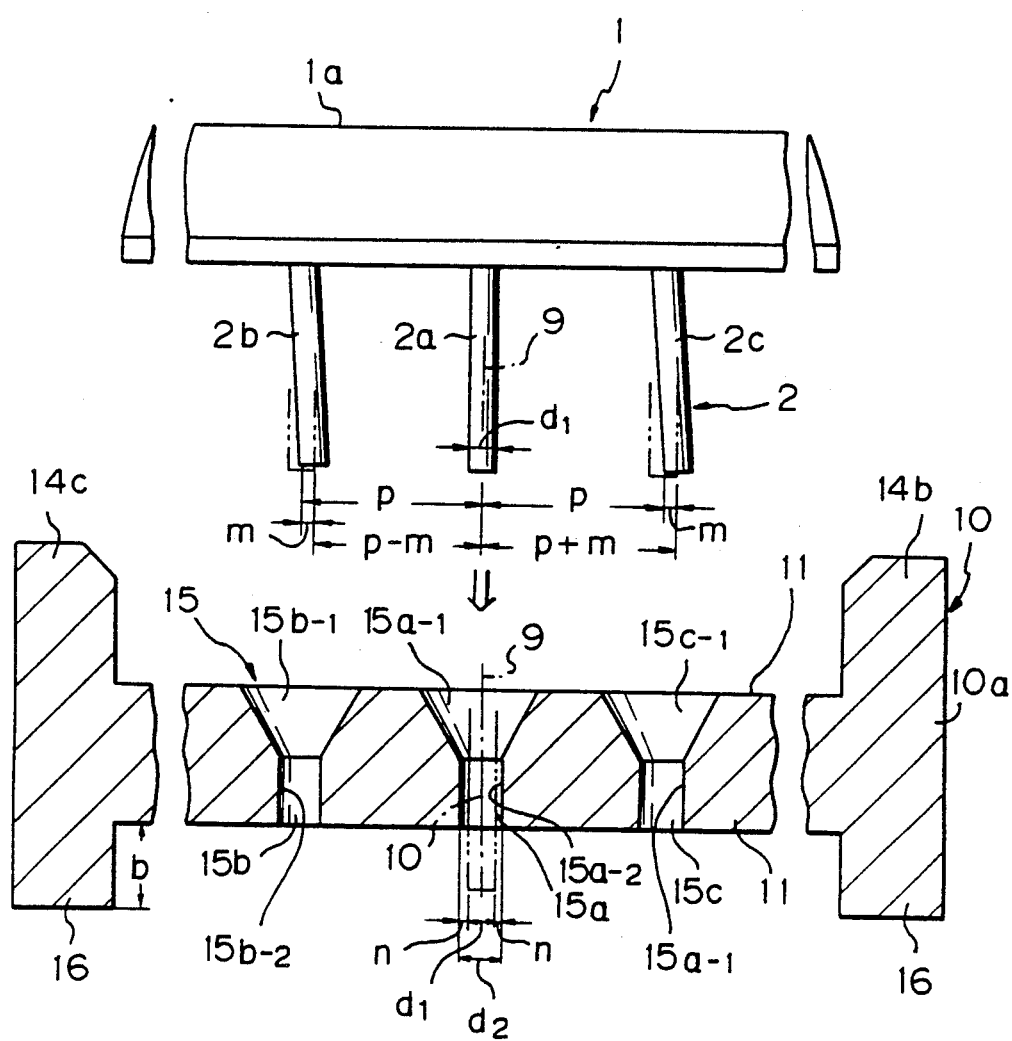
FIG. 3 is an enlarged, partial cross-sectional view of a carrier with a package.
Figure 4:
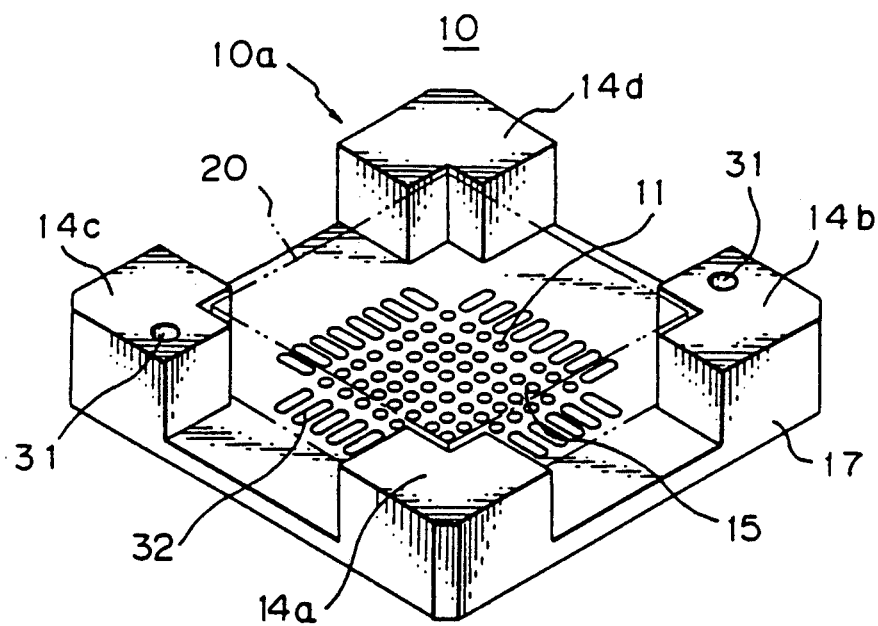
FIG. 4 is a perspective view of a carrier.

FIG. 3 is a cross-sectional view of a carrier with a package and FIG. 4 is a perspective view of a carrier.

As shown in FIGS. 3 and 4, a carrier 10 comprises a carrier body 10a consisting of a setting base 11 having package guides 14a, 14b, 14c, and 14d positioned at the four corners thereof.

The setting base 11 is provided with a plurality of holes 15 corresponding to the number of pins of a PGA package to be inserted.

The package 1 is a pin grid array (PGA) type package set on the carrier 10. The package is comprised of a package body 1a having a plurality of pins 2 projecting from the lower surface thereof and each having a diameter $d_1$, a pitch "p", and a tolerance "m". The pitch between the pins 2 (2a, 2b, 2c, ...) deviates within the range of $p \pm m$.

FIG. 3 shows three pins 2a, 2b, and 2c of a plurality of pins 2. The tolerance limit of the pin 2b deviates in a minus direction, and thus the pitch between the pins 2a and 2b is $p - m$. The tolerance of the pin 2c deviates in a plus direction, and thus the pitch between the pins 2a and 2c is $p \pm m$.

The holes 15a, 15b and 15c of the carrier 10 correspond to the pins 2a, 2b, and 2c, and are provided with tapered portions $15_{a-1}$, $15_{b-1}$, and $15_{c-1}$, respectively.

The diameter $d_2$ of the hole 15a, as shown in FIG. 3, is such that the value of play (n) of the pin 2a in the hole 15a in a horizontal direction, when the pin 2a is inserted into the hole 15a while matching the center line 9 of the pin 2a to that of the hole 15a, is smaller than the tolerance of the pitch of the pin 2.

Namely, the diameter $d_2$ of the hole 15a is such that it is smaller than the value $d_1 \pm 2$ m, i.e., $d_2 < d_1 \pm 2$ m. The diameter of the other holes 15b and 15c are similarly defined.

Figure 5:
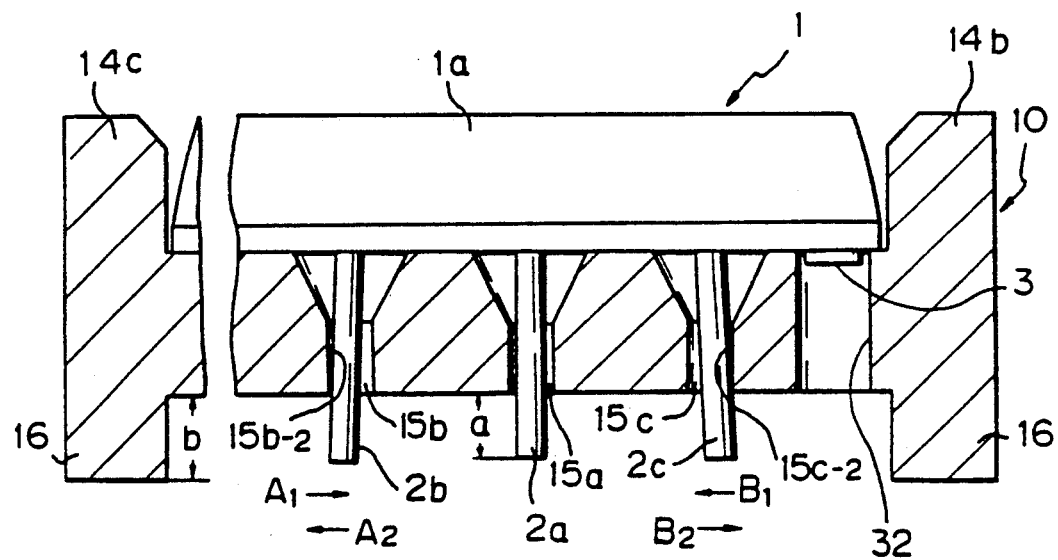
FIG. 5 is an enlarged partial cross-sectional view of a carrier having a PGA package set therein.

The setting of the package 1 on the carrier 10, and the set state, will now be explained with reference to FIG. 5.

When the package 1 is lowered from the position shown in FIG. 3, each corner of the package body 1a is guided by a respective guide portion (14a, 14b, 14c, 14d), so that the package 1 is accurately set and positioned on a setting base 11, and each pin 2 (2a, 2b and 2c) is inserted into a corresponding hole 15. During this operation, the pins 2a, 2b, and 2c are guided by the tapered portions $15_{a-1}$, $15_{b-1}$, and $15_{c-1}$ while being inserted into the holes 15a, 15b, and 15c.

Since the diameter d of the holes 15a, 15b, and 15c is defined as explained above, the pin 2b is deviated slightly to the pin 2a side as shown by the arrow $A_1$, when the pin 2b is inserted into the hole 15b, but when the pin 2c is inserted into the hole 15c, the pin 2c is deviated slightly to the pin 2a side as shown by the arrow $B_1$. Namely, the pins 2b and 2c are elastically moved in the directions $A_2$ and $B_2$, respectively, while coming into functional contact with the surface of the holes 15b and 15c.

The frictional contact prevents the package 1 from slipping out of the carrier 10, i.e., the package 1 is held in the set position.

The frictional contact with respect to each pin is very small, but when a plurality of pins 2 are in frictional contact with the surface of holes 15 into which the pins 2 are inserted, the total frictional contact force is very strong, and thus the package 1 can be held firmly in the carrier 10.

Therefore, further support of the package 1 becomes unnecessary, since the package 1 is firmly held by the frictional contact force and will not slip out of the carrier 10 when carried, etc.

Further, leg portions 16 having a length b which is longer than a length a, in order to prevent contact between the pins 2 and the lower surface of the setting base 11, are provided at the four corners of the carrier 10. Accordingly, when the carrier 10 having the package 1 set therein is placed on a flat surface such as a table (not shown), the face ends of the pins 2 cannot come into contact with the table, and the pins 2 will not be bent.

Figure 6:
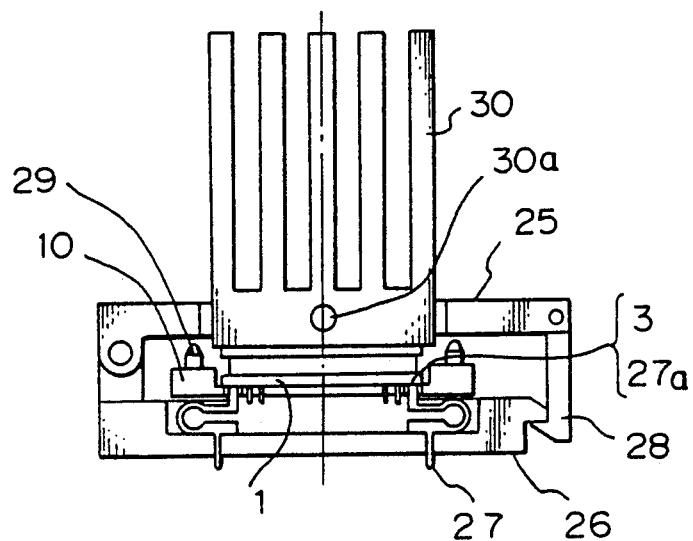
FIG. 6 is a cross-sectional view of a package, carrier and socket assembly according to the present invention.

When a burn-in process described above is to be carried out, the package 1 and the carrier 10 are mated with a socket 26, as shown in FIG. 6.

FIG. 6 is a cross-sectional view of an assembly of the package 1, carrier 10, and socket 26 according to the present invention.

Figure 7:
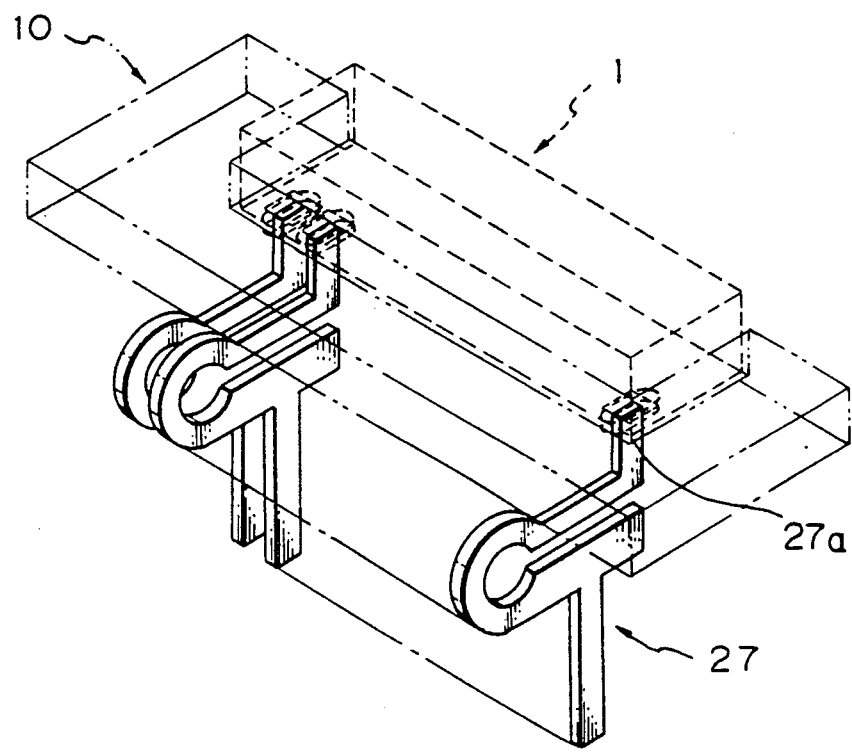
FIG. 7 is an enlarged schematic perspective detailed view of a contact.

FIG. 7 is a schematic perspective detailed view of a contact portion of the socket 26.

As shown in FIGS. 6 and 7, a lid 25 is fixed to a socket 26 by a pin 28 attached to the top end of the lid. When the lid 25 is fixed to the socket 26, the package 1 is placed under pressure from a heat sink 30, whereby the contacting portion 27a of a contact element 27 and the pads 3 are electrically connected. Each contact portion 27A extends through an access hole 32 in the carrier to contact a pad 3 of the package. The carrier 10 is correctly positioned on the socket 26 by fitting the position alignment pins 29 in the positioning holes 31 provided in the carrier 10. The heat sink 30 is pivotable around the center 30a as a support. The carrier 10 having a package 1 set therein is mated with the socket 26 while a pad of the package 1 is brought into contact with the contacting portion 27a of the contact 27 through the carrier 10, and accordingly, an electric current can be supplied to the pins 2 through the contact elements 27 and the pads 3 during the burn-in process. Heat in the package 1 is discharged through the heat sink plate 30.

Figure 8:
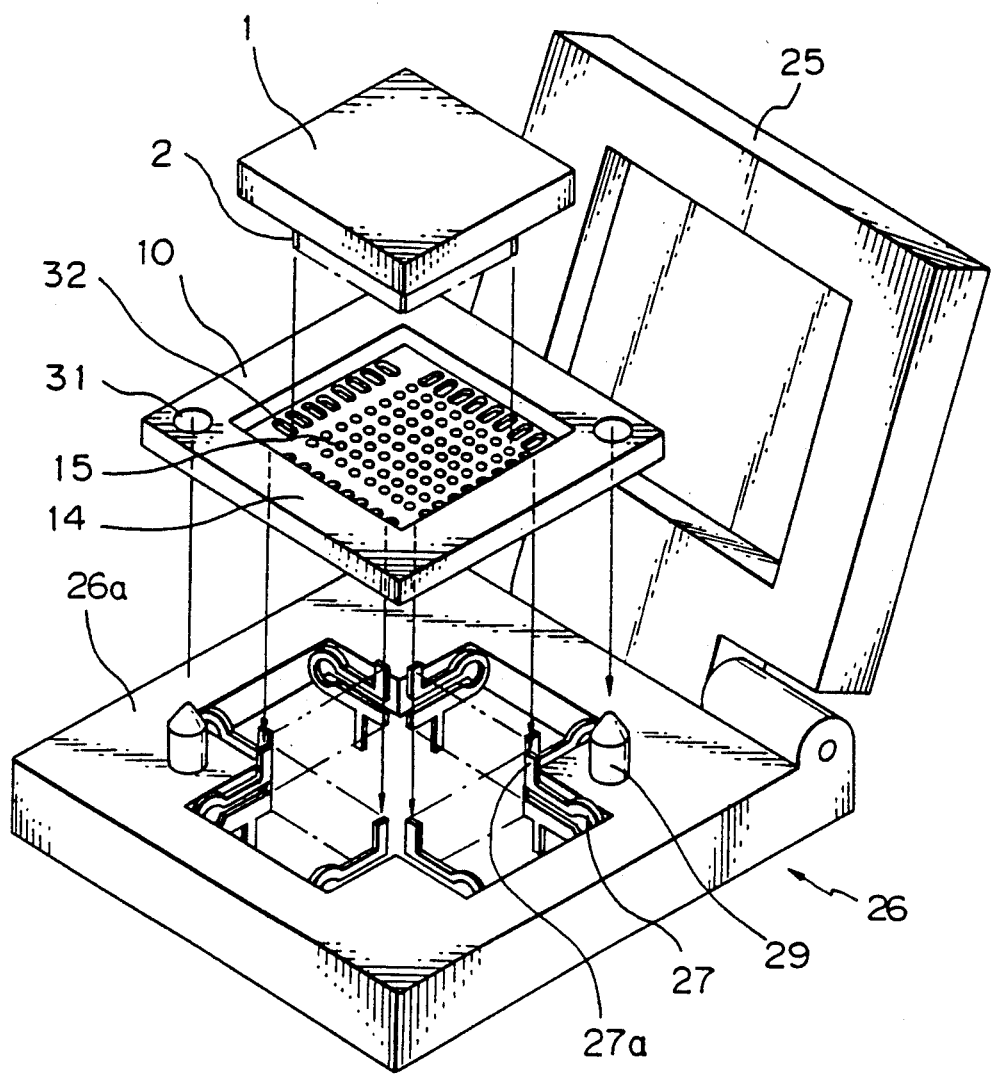
FIG. 8 is perspective view of a combination of a package, a carrier, and a socket.

FIG. 8 is a perspective view of a combination of a package, carrier, and socket according to the present invention.

As shown in FIG. 8, preferably positioning holes 31 are provided in the carrier 10, to ensure a correct mating of the socket 26 by fitting the holes 31 over projections 32 of the socket 26.

The PGA package 1 is received in a recessed portion formed by guide portions 14, and the plurality of pins 2 are inserted into holes 15 provided in a base of the carrier 10. Electric pads (not shown) provided on the back surface of the package 1 are opposed to access holes 32 provided around the holes 15 of the base of the carrier 10. The carrier 10 shown in FIG. 8 is different from those shown in FIGS. 3, 4 and 5 in that the guide portions 14 of the carrier 10 do not have four separate corner pads.

Accordingly, the package mounted carrier 10 is mated with the socket 26 by inserting the positioning pins 29 into the positioning holes 31, whereby contacting portions 27a of the contact 27 are inserted into the access holes 32 opposed to the electric pads provided on the back surface of the package 1, and by closing the lid 25, the pads are pressed against the contacting portions 27a. The socket 26 comprises a socket base 26a having a large window or opening at the center portion for receiving the pins 2. This window forms the chamber for protecting the pins 2.

The heat sink tins are omitted from the lid 25 of the socket of FIG. 8.

As explained above, according to the present invention the pins 2 of the pin grid array type package 1 can be received in the burn-in socket 26 without damage thereto. Further, since the connection for the electric power supply source can be made at the pads 3 provided on the package rather than through the pins, a satisfactory electric source current can be supplied.

We claim:

1. A package and socket unit for testing a pin grid array package comprising:

a pin grid array package having an array of pins and a plurality of pads electrically connected to certain of said pins, said pads surrounding an area in which said pins are arranged; and a socket having contact elements adapted to be electrically connected to said pads and a chamber in which said pins are received without contact between said pins and the inside walls of said chamber when said package is mated with said socket; said chamber having a depth which is greater than the length of said pins.

2. A package and socket unit for testing a pin grid array package according to claim 1, which further includes a carrier for holding said package, said carrier having access holes at positions corresponding to said pads whereby said contact elements may contact said pads to be electrically connected thereto.

3. A package and socket unit for testing a pin grid array package according to claim 2, wherein said carrier has holes formed therein in which said pins are received, the diameter of each hole being such that a value (n) of play of said pins in said holes in a horizontal direction when said pins are inserted into said hole while matching a center line of said pins to a center line of said holes, is smaller than a tolerance (m) of a pitch (p) of said pins.

4. A package and socket unit for testing a pin grid array package according to claim 2, wherein said carrier is provided with positioning holes and said socket is provided with positioning pins, to correctly position the carrier and the socket upon mating thereof.

5. A package and socket unit for testing a pin grid array package for an integrated circuit comprising:

a pin grid array package for an integrated circuit having a back surface, a plurality of pins provided vertically on the back surface, and a plurality of pads electrically connected to certain of said pins provided on the back around the peripheral area of said pins;

a carrier for holding said package, said carrier having a base facing said back surface of the package when said package is held by said carrier, a plurality of holes formed in said base and through which said pins are inserted;

a plurality of access holes formed in said base around the peripheral area of the holes, for exposing said pads to the back of said base, and a guide portion provided on said base, for positioning said package on said carrier; and a socket having a socket base for holding said carrier, a window means formed in said socket base, for receiving said pins when said package and said carrier are mated, a plurality of contacts having contact portions positioned around the peripheral area of said window means, said contact portions being inserted through said access holes so as to contact said pads when said carrier is held by said socket base, and a lid means provided on said socket base for pressing said package against said contacts.

6. A socket unit for an integrated circuit according to claim 5, wherein said carrier further is provided with positioning holes formed at corners of said carrier base, and said socket further having positioning pins formed on said socket base which are insertable into said positioning holes of said carrier base.

* * * * *

UNITED STATES PATENT AND TRADEMARK OFFICE
CERTIFICATE OF CORRECTION

PATENT NO. : 5,057,904

DATED : October 15, 1991

INVENTOR(S) : MITSUKI NAGATO and THUTOMU YOSHIZAKI

It is certified that error appears in the above-identified patent and that said Letters Patent is hereby corrected as shown below:

On title page and column 1, lines 1-2, should read --PACKAGE AND SOCKET UNIT--
On title page, item [56]; References Cited U. S. PATENT DOCUMENTS
"4,816,426 3/1985" to --4,816,426 3/1989--.

Column 1, lines 1 and 2, "SOCKET UNIT FOR PACKAGE HAVING PINS AND PADS" should be --PACKAGE AND SOCKET UNIT--;
line 13, "in" should be --is--.

Column 2, line 54, after "respectively" insert a comma --,--;
line 67, after "is" insert --a--.

Column 3, line 18, "pad" should be --pads--;
line 49, after "to" insert --be--.

Column 4, line 36, "d" should be --$d_2$--.

Signed and Sealed this

Ninth Day of March, 1993

*Attest:*

STEPHEN G. KUNIN

*Attesting Officer*    *Acting Commissioner of Patents and Trademarks*